United States Patent [19]

Gentile

[11] Patent Number: 5,055,769
[45] Date of Patent: Oct. 8, 1991

[54] METHOD AND APPARATUS FOR IDENTIFYING AC SERVICE CONFIGURATION

[75] Inventor: Philip J. Gentile, East Syracuse, N.Y.
[73] Assignee: The Fleming Group, Syracuse, N.Y.
[21] Appl. No.: 432,118
[22] Filed: Nov. 6, 1989
[51] Int. Cl.$^5$ ............................................. G01R 25/00
[52] U.S. Cl. ..................................... 324/86; 324/83 D
[58] Field of Search ................... 324/86, 83 R, 83 A, 324/83 D; 364/483, 492; 328/133

[56] References Cited

U.S. PATENT DOCUMENTS

| | | | |
|---|---|---|---|
| 3,555,417 | 1/1971 | Mitchell, Sr. | 324/86 |
| 4,626,622 | 12/1986 | Bouvrette | 324/83 R |
| 4,710,703 | 12/1987 | Harkiewicz et al. | 324/83 R |

Primary Examiner—Hezron E. Williams
Assistant Examiner—Louis M. Arana
Attorney, Agent, or Firm—Salzman & Levy

[57] ABSTRACT

A method and apparatus are described for determining the charcteristics of an alternating current electrical service at a remote panel as compared with a main panel from which the remote service is connected. The method involves the steps of selecting a line at the main panel and designating it as the reference. The phase relationship of other lines at the main service panel are determined relative to this reference by a process of deriving the period of the signal on the reference line, and from this point the phase relationship of the other line signals are determined. A counter is loaded with a value representative of the derived period of the reference signal, and finally, the characteristics of the individual service line signals at a remote location are determined by a step of comparing each with the characteristics derived for the main service panel.

14 Claims, 4 Drawing Sheets

METHOD AND APPARATUS FOR IDENTIFYING AC SERVICE CONFIGURATION

BACKGROUND OF THE INVENTION

1. Field of the Invention

The present invention, generally, relates to detecting the identity of respective components of an alternating current and, more particularly, relates to identifying a predetermined aspect of the configuration of alternating current at a remote location.

There are many instances in the field when multiple phases are used in a source of electrical power. For example, when an electric motor is to be controlled smoothly, such as in elevators or in the operation of machinery, alternating current is used.

When alternating current is used, it is frequently multiple phases, particularly when more work is to be done. It is the custom to use three phase electricity when the phase is to be multiple, because it is readily generated and is available almost universally.

The identity of phase characteristics relative to each other becomes most important in a three phase alternating current line source, not only at the main service panel but also at each remote service outlet. Several aspects of an alternating current line source, for example, include (1) phase rotation, (2) service configuration and (3) phase rotation identification compared to a known reference.

The control of a three phase device is interrupted when the sequence of the phases is connected incorrectly. Therefore, it becomes most important to be able to identify the characteristics of a three phase, alternating current power source anywhere it is necessary to connect an operating device. Phase identification is important and has intensified, due to utility companies attempting to measure power consumption profiles of equipment in buildings, especially commercial buildings where 3 phase power is common.

2. Description of the Prior Art

With the dramatic increase in use of three phase power, the search has intensified for an effective method and apparatus for identifying phase rotation, phase identification and service configuration at all needed locations.

In 1986, U.S. Pat. No. 4,584,652 issued to Sturza et al. which describes a processor which, when connected to a source, will detect components of a phase error.

In 1987, U.S. Pat. No. 4,636,720 issued to Farr which describes a device to monitor a three phase power source to detect a problem that may develop.

In 1988, U.S. Pat. No. 4,785,251 issued to Akiyama et al. which describes a device to detect frequency and phase differences between an input signal and a generated reference.

While each of these prior efforts may be effective in the intended circumstances, none will perform the needed feats which the present invention so uniquely is adapted to perform. This will become abundantly clear as the description proceeds.

SUMMARY OF THE INVENTION

It is an important object of the present invention to provide a method and an apparatus for identifying phase rotation at a remote alternating current power outlet with reference to a source for such power or another point of reference.

Another object of the invention is to provide a means for detecting the difference in phase identity and phase rotation at a remote three phase power outlet compared with the connection source of such power or any point of reference.

Briefly, a method and apparatus in accordance with the principles of the present invention provide for determining the characteristics of an alternating current electrical supply source for a remote electrical outlet to be tested, storing such characteristics, comparing the characteristics of a remote alternating current electrical outlet with the stored characteristics of the supply source or reference in order to identify phases at a remote location.

Other objects, features and advantages of the present invention will become apparent as the description proceeds. For a more complete understanding of the nature and objects of the present invention, reference is made to the following detailed description taken in conjunction with the accompanying drawings.

DETAILED DESCRIPTION OF THE INVENTION

In the following detailed description of the presently preferred embodiment of the invention, the term "phase" means either one of two lines of a split phase alternating current electrical source, or it means one of the three lines in a three phase alternating current electrical source. Of course, these particular uses are for illustrating the principles of the invention and are not intended to be limiting to the scope of the invention as defined in the claims appended hereto.

Figure 1:
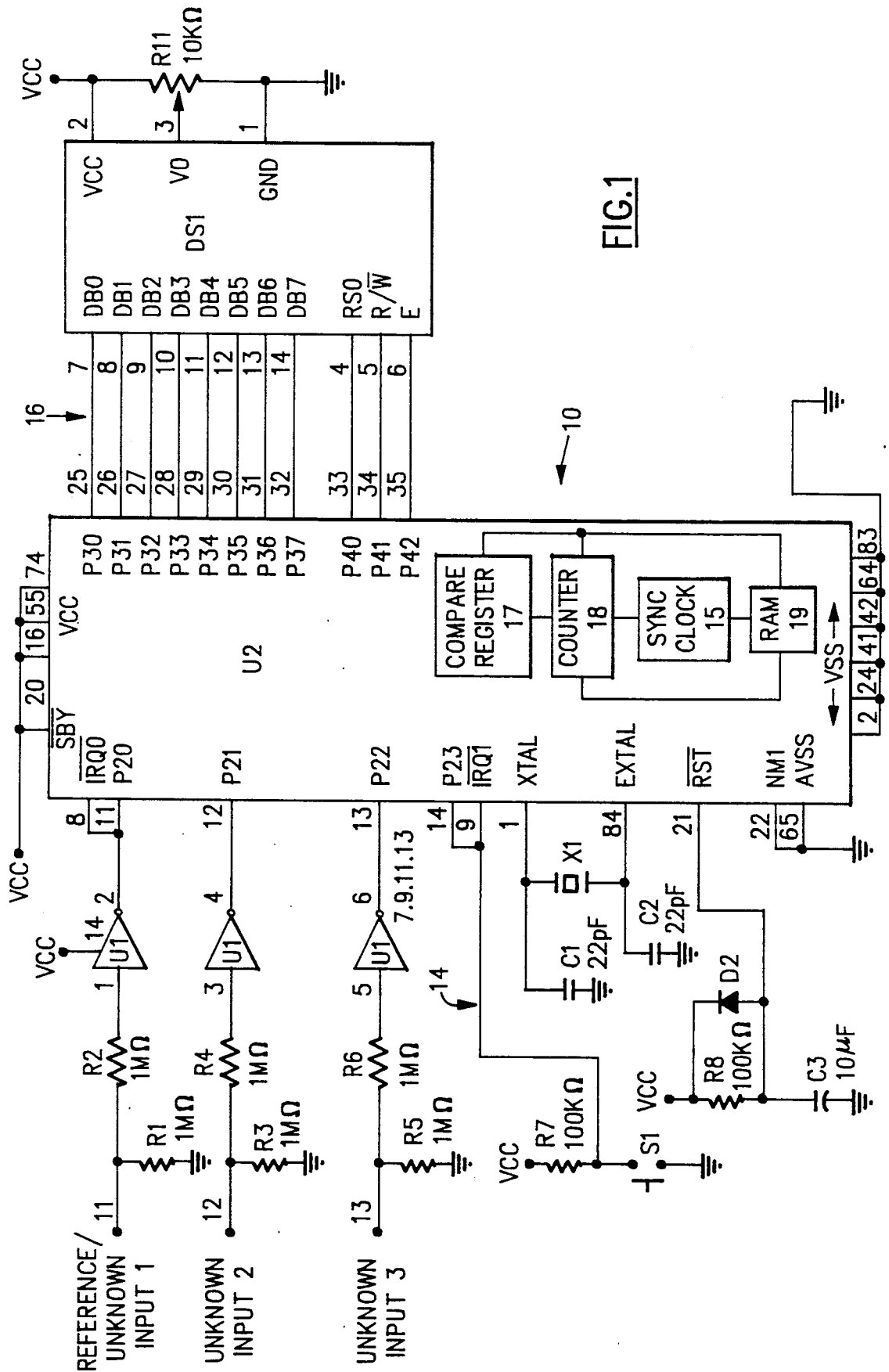
FIG. 1 is a circuit diagram illustrating features according to principles of the present invention for use in conjunction with the detailed description to follow.

Referring now to FIG. 1 of the drawings, the apparatus of the invention is identified generally by the reference numeral 10 and includes a circuit with three test leads identified by the numerals 11, 12 and 13. Each one of these test leads 11, 12 and 13 is formed of a unique color for greater ease in visual identification.

The test ends of the test leads are preferably provided with alligator-type quick-connect clips that are readily available commercially. Of course, other forms of connectors may be used if a particular use makes another connector more desirable, such as, for example, screw-on wide-mouth connectors, screw-on closed-end connectors, or even pointed push-type prongs.

Each of the test leads 11, 12 and 13 is connected, through a 1 MΩ, 1 Watt, 5% resistor R1, R3 and R5, respectively, to circuit ground. Also, each test lead is connected, through a resistor R2, R4 and R6 of like value, to respective integrated circuits U1. An integrated circuit (I.C.) package U1 includes two inverters and has two power pins 14 and 7 to power both inverters within the package U1.

The outputs of the I.C. U1 are connected to terminals P20, P21 and P22 of a microprocessor, identified in FIG. 1 by the legend U2. The microprocessor U2 is catalog No. H8/532, which is available commercially from Hitachi. Terminals P20, P21 and P22 are parallel input lines.

Also connected to the microprocessor U2 at a terminal P23 by means of a connection 14 is a switch S1 so that, when closed, the terminal P23 is connected to ground. When not closed, a voltage VCC is applied to the terminal P23 through a resistor R7, the value of which is 100 K$\Omega$, ¼ watt, 5%. The switch S1 is a spring type, normally open, single pole, single throw, push button.

The internal timing for the microprocessor U2, which provides a clock function as illustrated by a block 15, is determined by a crystal X1 connected between terminals 1 and 84 of the microprocessor unit U2. Each end of the crystal X1 is connected also to ground through a 22 pf, 50 volt capacitor, that is identified also by the legends C1 and C2. The crystal X1 in FIG. 1 operates at 20 MHz in the preferred embodiment and is readily available.

For the present use of the microprocessor U2 being described, the Reset terminal RST (also identified by the numeral 21) is connected to ground through a 10 $\mu$F, 15 volt capacitor and also through a parallel connection of a 100K$\Omega$, ¼ watt, 5% resistor R8 and a IN4004 diode D2 to the voltage VCC.

The terminals 2, 22, 24, 41, 42, 64, 65 and 83 on the microprocessor U2 are connected directly to ground, and the terminals 16, 20, 55 and 74 are connected to voltage VCC, which will be described in more detail presently.

For the microprocessor U2 to communicate with the operator, a visual display DS1 is connected by means of several lines, identified generally by the reference numeral 16 in FIG. 1. The several lines 16 connect terminals 25 through 32, respectively, on the microprocessor U2 to the respective terminals 7 through 14, on the display DS1 and terminals 4, 5 and 6, respectively, on the display DS1 to terminals 33, 34 and 35, respectively, on the microprocessor U2.

The visual display DS1 is connected to the voltage VCC at its terminals 1, 2 and 3, the terminal 2 being connected directly to the voltage VCC and the terminal 1 being connected directly to ground. A 10K$\Omega$ potentiometer R11 is connected across the terminals 1 and 2 with the variable terminal of the potentiometer R11 connected to the terminal 3 on the display DS1 to adjust the contrast.

While any suitable, low current display can be adapted for use with the microprocessor U2, a 6.5 volt LCD display available from Hitachi under catalog No. LM032L has been found to be quite effective. This Hitachi display DS1 has a display size of 83 mm wide by 18.6 mm high, with a weight approximating a couple of aspirin, making the entire apparatus 10 readily hand held.

Other important functions that are available with the microprocessor U2, in accordance with the invention, as will be more readily apparent as the description proceeds, are the sync clock 15, a compare register 17, a counter 18 and a random access memory (RAM) 19, as illustrated in FIG. 1.

Figure 2:
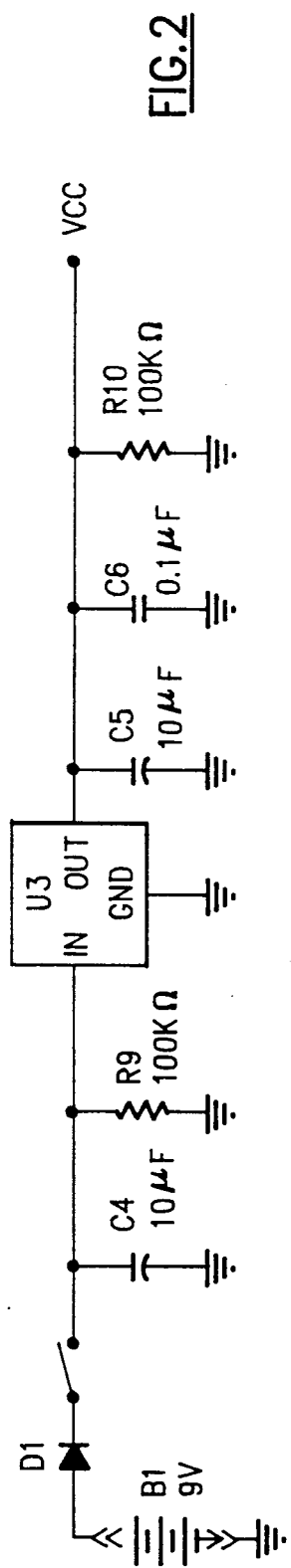
FIG. 2 is a circuit diagram of a power supply for developing the voltages needed for the operation of the circuit of FIG. 1.

Referring next to FIG. 2 of the drawings, a 9 volt direct current source B1 is connected between ground and one terminal of a diode D1, similar to the diode D2 in FIG. 1. For the apparatus 10 to be hand held and, therefore, readily portable, the 9 volt source B1, preferably, is a battery.

A single pole, single throw toggle type switch S2 is connected in series with a 10 $\mu$F, 5 volt capacitor C4 between the diode D1 and ground to function as an off-on switch. A 100K$\Omega$, ¼ watt 5% resistor R9 is connected in parallel across the capacitor C4 between the diode D1 and ground.

From the switch S2 and the parallel connected capacitor C4 and resistor R9, a connection is made to a voltage regulator U3, to provide a stable voltage level of 5 volts DC for VCC. This voltage regulator U3 is readily available commercially from such sources as National Semiconductor, Motorola and other manufacturers.

The output of the voltage regulator U3 is a 5.0 volt DC supply VCC, that is connected with the several places in FIG. 1 identified by the same legend VCC. Also, the output of the voltage regulator U3 is connected to circuit ground through a parallel arrangement of a 10 $\mu$F, 15 volt capacitor, a 0.1 $\mu$F, 50 volt capacitor and a 100K$\Omega$, ¼ watt, 5% resistor R10, all connected in parallel between the output of the voltage regulator U3 and the circuit ground.

Figure 3:
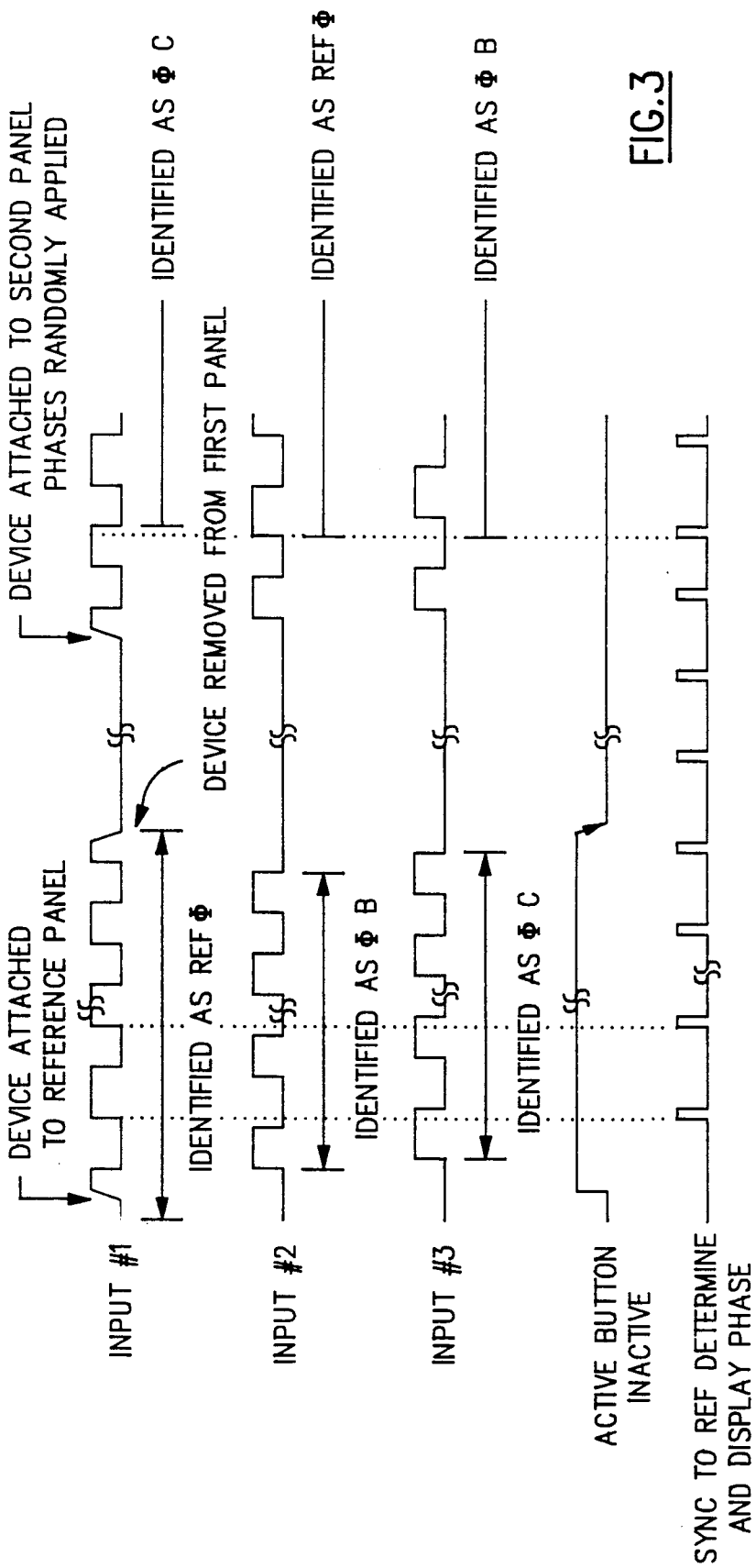
FIG. 3 is a chart to illustrate the relative timing of the respective signals generated during the operation of the circuit shown in FIG. 1.

Referring to FIG. 3 of the drawings, the waveforms described as "Input 1, 2 and 3" are the signals generated by the inverters contained in I.C. U1, when connected to an AC service. The waveform described as "Button" represents the current state of the push button switch S1 (FIG. 1). The term "active" means that the button S1 is pressed; "inactive" means the button S1 is not pushed. The waveform described as "sync to ref" depicts microprocessor activity synchronized to the Reference Input. During the active periods, the microprocessor U2 attempts to determine phase relationships of inputs 1, 2 and 3, and to display the phase information.

Figure 4:
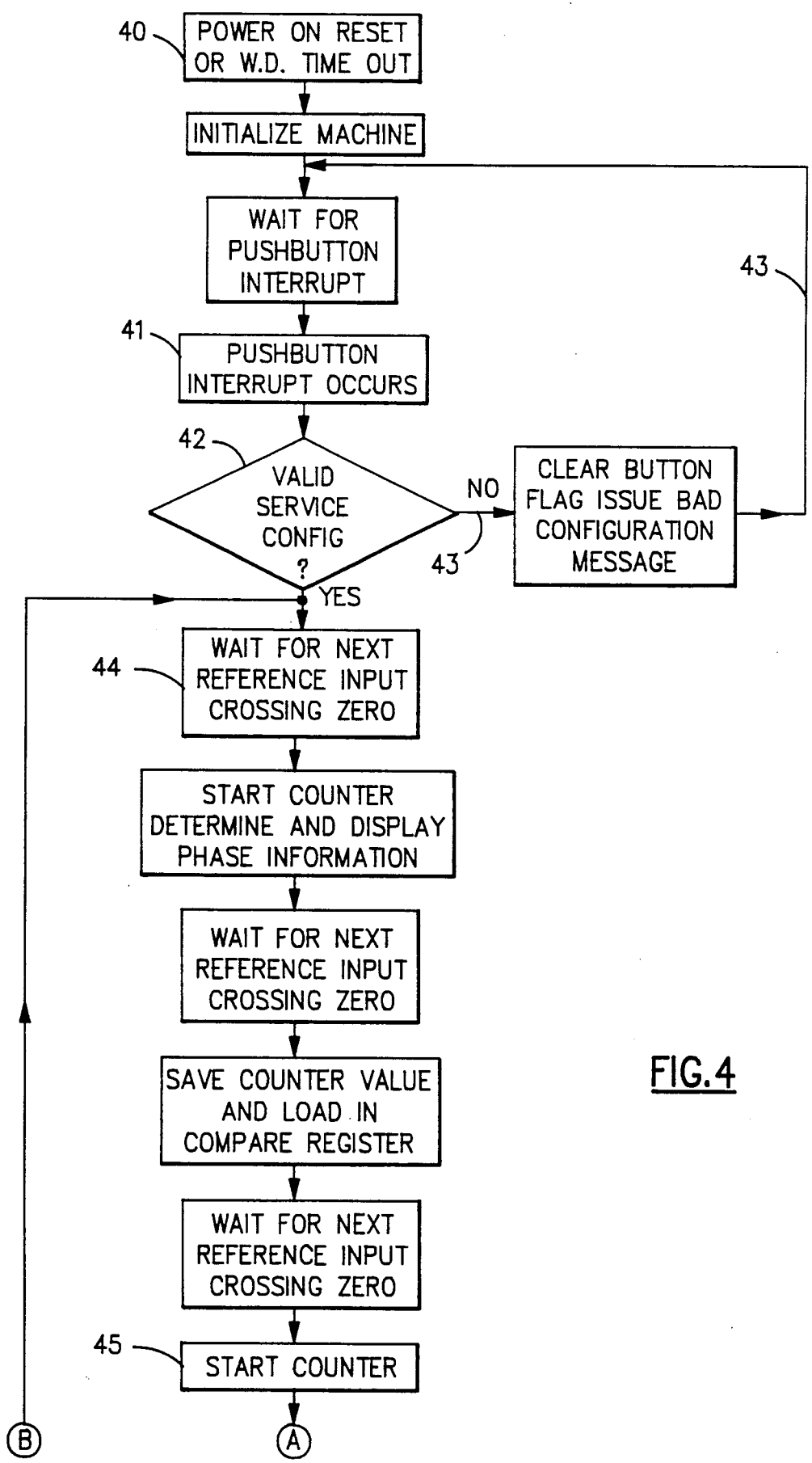
FIG. 4 is a first half of a flow chart indicating in chart form the operation of the circuit of the invention according to the method of the invention.
Figure 5:
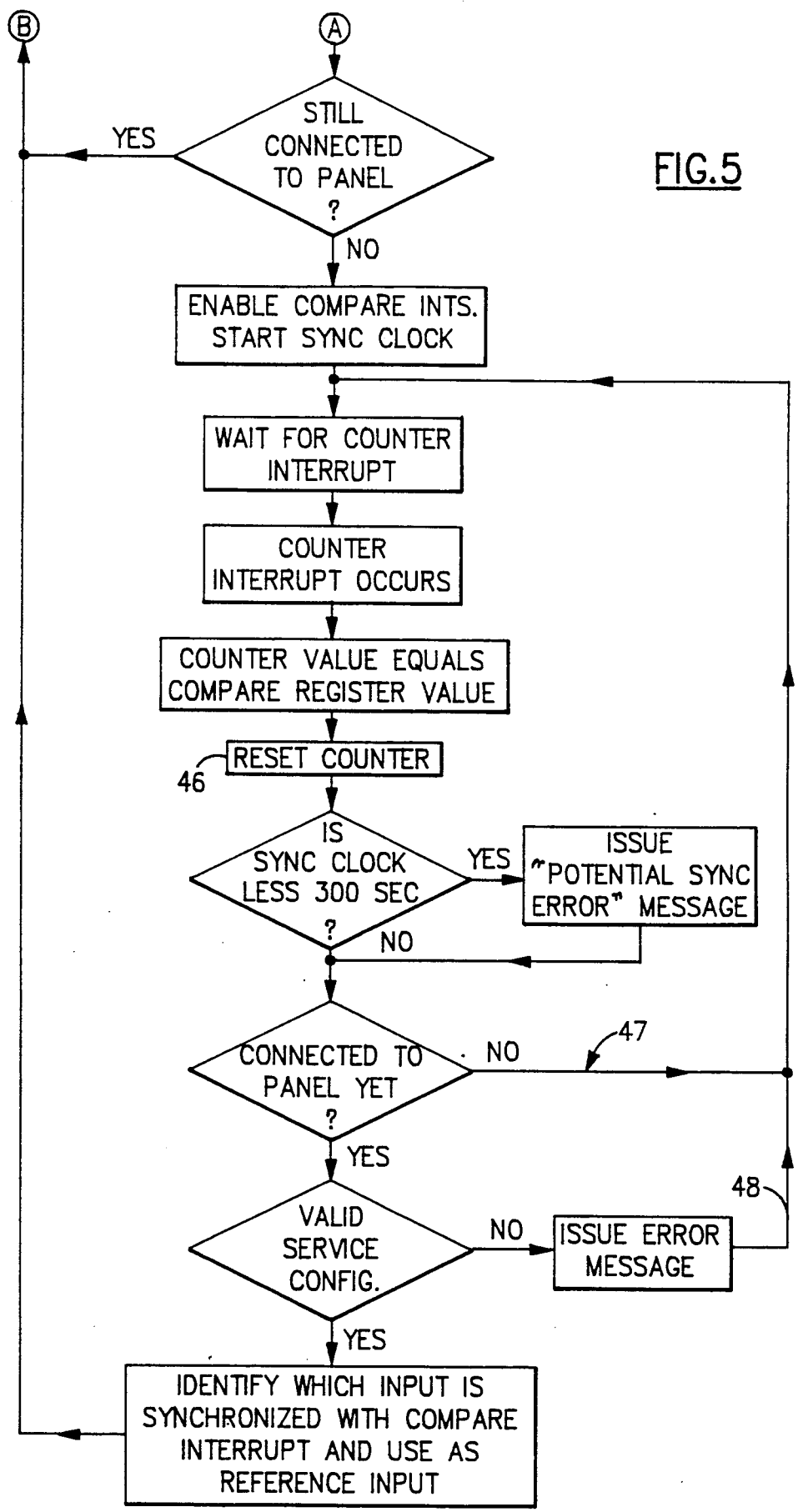
FIG. 5 is the second half of the flow chart of FIG. 4.

By the flow chart in FIGS. 4 and 5, the operating sequence of the apparatus 10 (FIG. 1) is illustrated. The operating sequence is initiated by first closing the switch S2. Then the push button switch S1 is pushed. The switch S2 applies power to the apparatus, and S1 starts the initializing sequence.

The initializing sequence includes: setting up the microprocessor ports, initializing the display DS1 and initializing an on-chip RAM 19 to default values required for operation. Upon completion of initialization, the display device DS1 will show a message signifying that the apparatus 10 is ready to operate.

The display DS1 is initialized by sending ASCII codes for carriage return and Home via port 2 for the actual code; and by sending a read pulse via port 4. The message displayed is the ASCII string "READY" and is stored in ROM for retrieval by the microcomputer U2. Internal process functions consist of programs, well known in the art and therefore not described in detail herein, which are needed to determine interrupt timing, display driving, and I/0 routines.

At this point in the sequence of operations, the apparatus 10 is ready for operation, which is begun by pushing the button S1. This sets a reference flag in internal software, causing the microprocessor U2 to synchronize its function with a signal on the input test lead that is designated Reference Input Lead.

The same internal software of the microprocessor U2 resets the reference flag when the synchronizing step is completed and the apparatus 10 can be disconnected from the panel.

Now the apparatus 10 is carried to a remote panel location at which alternating current input lines are to be identified, and the test leads are connected. It does not matter which test lead is connected to which alternating current input line, as will be understood presently.

The apparatus 10 tests the service configuration by comparing the phase sequence with the sequence that was preset at the main panel and indicates the results of the comparison on the display DS1.

All displayed characters are stored in ROM as ASCII characters and are retrieved as need by the microcomputer U2. The display control signals are generated by a series of microcomputer instructions which generate low speed read/write pulses needed by the input latches in the display.

It does not matter which of the test leads is connected to which line at the remote service panel, since all measurements and readings are made relative to the first, or main, panel to which the apparatus was connected. However, there is a time limit that the apparatus 10 may remain disconnected, and the duration of such a disconnect interval is a function of the parts used. A maximum time interval between the time the apparatus 10 is disconnected from the first, or main, panel and the time it is connected at a remote panel location is 5 minutes.

Upon completion of a test at one remote panel location, an operator, having identified the lines and the phases on each, can reconnect the test leads in the order they were on the first, or main, panel. The time sequence is reset to zero upon completion without having to return to the first, or main, panel. This gives the operator the full 5 minutes to arrive at another remote panel location.

In a multi-story building, the number of remote panel locations can easily exceed 100, and each remote panel location can easily be farther from the main panel location than the preceding remote panel location. Of course, a building can have multiple main service entrances, in which case the operation just described must be repeated, beginning at each of the main service panel locations and carried forward for each remote panel location from each of the main service panel locations.

There are several factors that must be considered in a determination of the 5 minute time interval mentioned above. Actually, since these factors influence each other, the relationship that sets the time "T" is as follows:

$$T = P^2/6 * CLK$$

where:
T = time in seconds,
P = period of the line frequency,
CLK = period of the timing clock.

The 5 minutes, mentioned hereinabove, is determined by a clock with a frequency rate of between 45 Hz and 65 Hz. Tests indicate that none of the respective component parts of the apparatus 10, other than the clock 15, affects the time interval "T". The clock 15, in this presently preferred embodiment of the invention, is a part of the commercially available microprocessor U2. Therefore, it may be adjusted in accordance with the above relationship or an external or separate clock may be used.

The apparatus 10 will operate effectively across an input, or line, voltage range of 102 volts to 319 volts. This range corresponds to 120−15% volts to 277+15% volts.

The operating voltage range is determined and specified by the common services encountered by normal use. For example, the majority of services are less than 300 VAC from phase to neutral or 500 VAC phase to phase, as is the case of WYE and Delta services. Since the invention generates a ground reference internal to itself by the input resistors R1, R3 and R5, no "neutral" input is needed. This causes the circuit to respond the same to WYE or Delta services. Skew is caused by differences in gate propagation delay. Cause of skew can be attributed to differences in gate threshold voltage or differences in internal load capacitance between individual gates.

The three alternating current line voltage signals are fed into respective I.C. U1 (FIG. 1) to convert the sinusoidal wave of the input line voltage into a square wave. The I.C. U1 responds to unipolar signals between supply rails only with the switching threshold resting nominally at Vdd/2.

Since the input wave is a sine wave and since the threshold is above zero volts, a skew will result in the leading edge of the gate output referred to the input.

Ideally, the gate output should go "high" as soon as the sine wave passes zero. This will result in a skew with a positive value. As the sine wave passes its peak and approaches zero, the gate output will go "low" before the sine wave actually reaches zero.

This results in a skew with a negative value referred to the sine wave zero crossing. The net effect of this is that the gate output square wave is not as wide as the input wave form. The narrowing is not a problem, since the shrinkage is approximately 8 microseconds and pulse rate frequency (PRF) actually determines synchronization and not duty cycle.

However, a difference in the threshold voltage of the gates can cause different skews. The differences in skew subtracts directly from the window time that the microprocessor has to determine the phase relationship of the input wave forms. To show worst case effect, thresholds of two gates are assumed to be Vdd and Vss, respectively. The skew, in time, is expressed as follows:

$$T_{skew} = [P \sin^{-1} \times (V_t/V_{pk})]/360$$

where:
$T_{skew}$ = time in skew,
P = period of input signal @60 Hz,
$V_t$ = threshold of gate,
$V_{pk}$ = peak input voltage.

Assuming threshold voltage drift is a second order of magnitude, as compared to absolute value of threshold voltage, the skew then becomes a fixed percentage of the input signal period and can be handled readily by firmware. Thermal induced drift should cause thresholds to track each

MODES OF OPERATION

The apparatus described hereinabove functions with the following modes of operation:

MODE 1—During this interval, the apparatus of the invention determines whether the service configuration is network, split phase, WYE connected or delta connected.

MODE 2—The apparatus determines or sets the reference phase and establishes the relationship of the other input lines relative to this phase.

MODE 3—This is the period of time that the apparatus of the invention is waiting (an idle period).

MODE 4—This is the interval when determination is made of phase relationship at a remote service panel compared with the phases of the respective input lines at the main panel.

With particular reference to FIG. 4 and FIG. 5 of the drawings, a more detailed operation of the device of the present invention is herein presented. The apparatus 10 (FIG. 1) is powered-up, or a watch dog timer overflow occurs, as indicated by the block 40. Either of these two events cause an initialization sequence to begin.

The microprocessor U2 initializes itself by clearing the display DS1 and setting up the input-output ports. Port 2 is the input port, port 3 is an output port used to send data to the display, port 4 is an output port used to send control signals to the display DS1. At this point, the microprocessor U2 enters a wait condition, which continues until an interrupt is caused by actuation of the push button S1. The occurrence of a wait condition interrupt is indicated in FIG. 4 by the block 41, and the microprocessor U2 now exits its wait condition.

Now the microprocessor U2 views the conditioned AC input signals produced by the inverter part of each one of the three integrated circuits U1 (in FIG. 1). The AC input signals must match one of the predetermined conditions for service configurations. While any number of conditions can be established, a test is made at the block 42 in FIG. 4 to verify compliance. A service is considered valid when three signals are all read periodically by the microcomputer U2 and the signals all prove to be not in phase with one another. For example, when input is detected, if after a sequence of reads, two signals of the three are shown to be in phase with each other, the input signals are not a valid three-phase source. This condition indicates that the device is not connected properly, or that a non-standard service exists. The inventive device is designed to operate only with standard service configurations.

If service is not valid, the operating cycle is returned to the wait condition, illustrated by a return line 43. An error message representative of such a lack of compliance with any predetermined condition is sent to the display DS1 via digital output port bits P30 through P37 and P40 through P42 from the microprocessor U2.

When the predetermined conditions are matched, the microprocessor U2 waits for the next AC line zero voltage crossing, illustrated by the block 44. The signal is derived from reference input connected to the resistor R2.

Upon detection of a zero voltage crossing, a counter is started immediately. The AC signals are viewed and the phase relationship is determined and sent to the display DS1. The signal with the zero crossing is said to be the reference phase. The input being low at that time is labeled Phase C. And the input being high at that time is labeled Phase B.

Now, the microprocessor U2 enters a wait condition, waiting for the next zero voltage crossing. This wait condition is exited upon detection of the next zero voltage crossing.

The microprocessor U2 immediately saves the counter value and stores it in the compare register 17 (FIG. 1). The counter 18 is reset and then halted. The microprocessor U2 now enters a wait condition in which it waits for the next zero voltage crossing. Upon detection of a zero voltage crossing, the counter is started, and this is illustrated by the block 45.

The microprocessor U2 views the signal inputs to verify that the AC signal source is still present. If it is still present, the steps described above from the block 44 through the block 45 are repeated. This is done to continually resynchronize the counter, allowing maximum disconnected synchronization time.

The microprocessor now enables interrupts caused by the match between the counter value and the value stored in the compare register 17. In addition, the clock 15 is started, i.e., the sync clock 15, which records the time since the device was connected to the AC line source.

The microprocessor U2 now enters a wait condition. It is the compare interrupt that is anticipated. The counter value reaches the value stored in the compare register 17, and a counter interrupt occurs when this value matches the value stored in the compare register 17.

The microprocessor U2 immediately resets the counter 18 to zero, and this is illustrated in FIG. 5 by the block 46.

The sync clock 15 is checked for a value less than 300 seconds. If the value does exceed 300 seconds, the microprocessor U2 sends a potential sync error message to the display DS1, but if the value is less than 300 seconds, the microprocessor U2 checks to verify the presence of AC line signals. If no signal is detected, the microprocessor returns to a wait condition, as illustrated by the return line 47.

However, if an AC line signal is detected as being present, the microprocessor U2 views the AC line signal for a match with the signals stored. If no match is detected, an error message is issued over a line 48 to return the microprocessor U2 to the wait condition for the counter interrupt, but if a match is detected, the microprocessor U2 will identify which input signal is synchronized with the compare interrupt. This input is termed the reference phase, or more commonly, phase A.

The relationships of the other phases are determined now from this information, and the phase relationship information is sent to the display DS1.

Phase relations are determined by labeling the reference phase as phase A. The nature of the three phase service is such that when the reference phase crosses zero, the C phase will be past the positive going zero crossing and will cause a logic high to be read by the microcomputer U2. At the same time, B phase will be approaching the positive going zero crossing and will cause a logic low to be read by the microcomputer U2. Once again, FIG. 3 input inputs 1, 2 and 3 waveforms are descriptive of such operation.

While an apparatus in accordance with the present invention and a method of operation have been described in substantial detail, various modifications can be made by one skilled in the art. However, it is understood that all such modifications that fall within the spirit and scope of the appended claims are within the present invention.

What is claimed is:

1. A method for identifying at a remote location the configuration and the phase relationship of a plurality of low frequency alternating current input signals having a preset line period, relative to the configuration and the phase relationship of a plurality of low frequency alternating current signals at a main location, the steps comprising:

a) at said main location, selecting one of said alternating current input signals for designation as a reference signal;

b) deriving the period of said reference signal;
c) determining the phase relationship of the other of said plurality of alternating current input signals relative to said reference signal at said main location;
d) loading a counting means with a value representative of said derived period of said reference signal; and
e) subsequently comparing each of said plurality of low frequency alternating current input signals at a remote location with said derived period for identifying the reference signal for said plurality of alternating current input signals at said remote location, whereby said configuration and said phase relationship at said remote location are determined.

2. A method for identifying at a remote location the configuration and the phase relationship of a plurality of alternating current input signals as described in claim 1 wherein the number of low frequency alternating current input signals is at least two.

3. A method for identifying at a remote location the configuration and the phase relationship of a plurality of alternating current input signals as described in claim 2 including the step of timing said period of said derived reference signal with a preset synchronized timed period for use in said comparing of said signals at said remote location.

4. A method for identifying at a remote location the configuration and the phase relationship of a plurality of alternating current input signals as described in claim 3 wherein said step of determining the phase relationship of the other of said signals at said main location includes the step of determining also the relative phase rotation of said signals.

5. A method for identifying at a remote location the configuration and the phase relationship of a plurality of alternating current input signals as described in claim 4 including the step of connecting temporarily respective input lines for making said selecting step at said main location.

6. A method for identifying at a remote location the configuration and the phase relationship of a plurality of alternating current input signals as described in claim 5 including the step of disconnecting each temporary connection to respective input lines at said main location, so that connections may be made at said remote location.

7. A method for identifying at a remote location the configuration and the phase relationship of a plurality of alternating current input signals as described in claim 6 including the step of connecting temporarily respective input lines for making said comparing step at said remote location.

8. A method for identifying at a remote location the configuration and the phase relationship of a plurality of alternating current input signals as described in claim 7 including the step of resetting said counting means after each of said derived periods.

9. A method for identifying at a remote location the configuration and the phase relationship of a plurality of alternating current input signals as described in claim 8 including the step of storing the period of said reference signal that is developed during said deriving step.

10. A method for identifying at a remote location the configuration and the phase relationship of a plurality of alternating current input signals as described in claim 9 including the steps of preselecting the time limit for resetting said counting means, and storing said time limit as a limit for the period of said reference signal.

11. A method for identifying at a remote location the relative phase relationship of an alternating current service configuration and its comparison with a predetermined reference location, the steps comprising:
a) connecting a first test lead to a first source of two signals at said predetermined reference location and assigning it as a reference signal source;
b) connecting a second test lead to a source of a second signal of said source of two signals at said predetermined reference locations;
c) deriving the alternating current period of said reference signal;
d) loading a counting means with a value representative of said alternating current period;
e) determining a phase relationship of said second signal relative to said reference signal at said predetermined reference location;
f) disconnecting said first and second test leads from said source of said first and second signals at said predetermined reference location, and connecting means defining two signals at a remote location, a phase relationship of which is unknown; and
g) determining the phase relationship of said two signals at said remote location by a comparison with said phase relationship determined at said predetermined reference location.

12. A method for identifying at a remote location the relative phase relationship of an alternating current service configuration as described in claim 11 including the step of storing said alternating current period after it is derived.

13. A method for identifying at a remote location the relative phase relationship of an alternating current service configuration as described in claim 12 including the step of timing said period of said reference signal with a preset synchronized timed period for use in said comparison with said phase relationship at said predetermined reference location.

14. A method for identifying at a remote location the relative phase relationship of an alternating current service configuration as described in claim 13 including the step of resetting said counting means after said alternating current period is derived.

* * * * *